United States Patent
Steinmann et al.

(10) Patent No.: US 8,932,942 B2
(45) Date of Patent: Jan. 13, 2015

(54) METHOD OF FORMING AN ELECTRICAL CONTACT BETWEEN A SUPPORT WAFER AND THE SURFACE OF A TOP SILICON LAYER OF A SILICON-ON-INSULATOR WAFER AND AN ELECTRICAL DEVICE INCLUDING SUCH AN ELECTRICAL CONTACT

(75) Inventors: Philipp Steinmann, Richardson, TX (US); Manfred Schiekofer, Freising (DE); Michael Kraus, Marzling (DE); Thomas Scharnagl, Tiefenbach (DE); Wolfgang Schwartz, Au in der Hallertau (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/729,682

(22) Filed: Mar. 23, 2010

(65) Prior Publication Data
US 2010/0244184 A1 Sep. 30, 2010

(30) Foreign Application Priority Data
Mar. 24, 2009 (DE) .................. 10 2009 014 507

(51) Int. Cl.
*H01L 29/06* (2006.01)
*H01L 21/74* (2006.01)
*H01L 21/02* (2006.01)
*H01L 21/84* (2006.01)

(52) U.S. Cl.
CPC ......... *H01L 21/743* (2013.01); *H01L 21/02532* (2013.01); *H01L 21/02639* (2013.01); *H01L 21/84* (2013.01)
USPC .......................................................... 438/481

(58) Field of Classification Search
USPC ................................... 438/481; 257/E21.569
See application file for complete search history.

(56) References Cited

U.S. PATENT DOCUMENTS

| | | | |
|---|---|---|---|
| 2003/0008438 A1 | 1/2003 | Abbott et al. | |
| 2003/0104658 A1* | 6/2003 | Furukawa et al. | 438/151 |
| 2003/0122124 A1 | 7/2003 | Nagano et al. | |
| 2006/0225642 A1* | 10/2006 | Kanzawa et al. | 117/89 |
| 2008/0119002 A1* | 5/2008 | Grosjean et al. | 438/50 |

FOREIGN PATENT DOCUMENTS

DE 10003014 A1 8/2000

* cited by examiner

*Primary Examiner* — Fernando L Toledo
*Assistant Examiner* — Valerie N Newton
(74) *Attorney, Agent, or Firm* — Jacqueline J. Garner; Frederick J. Telecky, Jr.

(57) ABSTRACT

Method of forming an electrical contact between a support wafer and a surface of a top silicon layer of a silicon-on-insulator wafer. The method comprises etching a cavity into the top silicon layer and the insulator layer. A selective epitaxial step is performed for growing an epitaxial layer of silicon inside the cavity up to the surface of the top silicon layer. An electrical device comprising an electrical contact between a support wafer and a surface of a top silicon layer of a silicon-on-insulator wafer formed according to the inventive method.

10 Claims, 1 Drawing Sheet

METHOD OF FORMING AN ELECTRICAL CONTACT BETWEEN A SUPPORT WAFER AND THE SURFACE OF A TOP SILICON LAYER OF A SILICON-ON-INSULATOR WAFER AND AN ELECTRICAL DEVICE INCLUDING SUCH AN ELECTRICAL CONTACT

FIELD OF THE INVENTION

The present invention generally relates to a method of forming an electrical contact between a support wafer and a surface of a top silicon layer of a silicon-on-insulator wafer (SOI). The invention further relates to an electrical device comprising an electrical contact, formed according to the method.

BACKGROUND

Silicon-on-insulator wafers are increasingly used in the semiconductor industry. For circuits with sub-micron structures, SOI wafers may be used comprising an epitaxial top silicon layer on the insulator. This leads to a nearly default-free surface.

Semiconductor-on-insulator wafers are used by digital applications, where they have significantly improved performance over the conventional (bulk) material. It is possible to produce low-voltage and low-power devices with reduced parasitic capacitances. Thus switching times are reduced. A good decoupling between different components is possible because of the insulating oxide layer.

Semiconductor-on-insulator wafers are also used for forming combined digital and analog circuits, as well in high speed applications as in power supply applications.

A disadvantage of the presence of the buried oxide of the SOI wafer is the high cost to put the support wafer underneath the buried oxide on a defined potential. This is typically achieved by downbonding on the package. For precision applications it is necessary to have the support wafer on a defined potential (usually the most negative) in order to avoid capacitance fluctuations between the support wafer and transistor bodies.

It is generally cheaper to put the support wafer on a defined potential by providing the electrical contact by etching a cavity like a hole or a trench through the top silicon layer and the buried oxide layer. This cavity is then filled by polycrystalline silicon. But polycrystalline silicon, which is easy to handle for filling up a cavity, implies that the surface of the top silicon layer will not be monocrystalline anymore. Thus, the electrical contact creates faults in the surface of the top silicon layer. The degraded surface will lead to problems in the manufacturing of the semiconductor device on top of the top silicon layer.

Another possibility to fill up the contact cavity is to perform the usual epitaxial step for growing an active layer on the surface of the silicon top layer and filling the cavity at the same time. Although it is possible to fill the cavity during the epitaxial step, the surface of this layer will have a depression above the filled-up cavity. This depression may be of a depth of about 1 to about 2 micrometers. This depression represents a yield hazard in that it will collect particles during subsequent processing and generate defects.

It is an object of the invention to provide a method for filling up the contact cavity without degrading the surface of the top silicon layer.

SUMMARY

The invention provides a method of forming an electrical contact between a support wafer and a surface of a top silicon layer of a silicon-on-insulator wafer. The method comprises etching a cavity into the top silicon layer and the insulator layer. Afterwards a selective epitaxial step is performed for growing an epitaxial layer of silicon inside the cavity up to the surface of the top silicon layer. In a selective epitaxial process, an epitaxial layer is only deposited in designated areas. Here, the epitaxial layer is only formed inside the cavity.

In an aspect of the invention an oxide layer is formed on the surface of the top silicon layer and a patterned photoresist layer is formed on the oxide layer prior to etching the cavity. When performing the etch step, the oxide layer will be etched as well, forming an oxide mask. Oxide masks, also referred to as hard masks, are known in the state of the art as possibility to pattern a surface. Usually, they have a thickness of more than 100 Å, often even of several hundreds of Å.

In an aspect of the invention the oxide mask formed during the etch of the cavity is used when performing the selective epitaxial step for filling the cavity.

Advantageously, an etching gas is used during the selective epitaxial step to prevent growing of the epitaxial layer on the surface of the oxide mask. This gas may be hydrochloric acid.

In an advantageous embodiment the oxide mask has a thickness comprised between about 10 Å and about 20 Å. It is possible to use such a small thickness when the oxide mask is protected by the photoresist during the etch.

When using an oxide mask of such a small thickness, advantageously a baking step under hydrogen is performed in-situ after the selective epitaxial step for removing the oxide mask. This step may be performed without any further processing of the wafer in-between. The hydrogen will reduce and remove the oxide.

In an aspect of the invention, an additional epitaxial layer of silicon may be grown on the surface of the top silicon layer and on the surface of the epitaxial layer of silicon formed inside the cavity after removing the oxide mask. If the oxide mask has been removed in a baking step, the additional epitaxial layer of silicon can be grown in-situ.

Thus, it is not necessary to remove the wafer from the epitaxial furnace between the selective epitaxial step and the further step of growing an additional epitaxial layer of silicon, which may be for example a collector layer.

The invention further provides an electrical device formed on a semiconductor-on-insulator wafer comprising an electrical contact formed according to the inventive method.

BRIEF DESCRIPTION OF DRAWINGS

The disclosed invention will be described with reference to the accompanying drawings in which.

DETAILED DESCRIPTION OF THE PREFERRED EMBODIMENT

Figure 1:
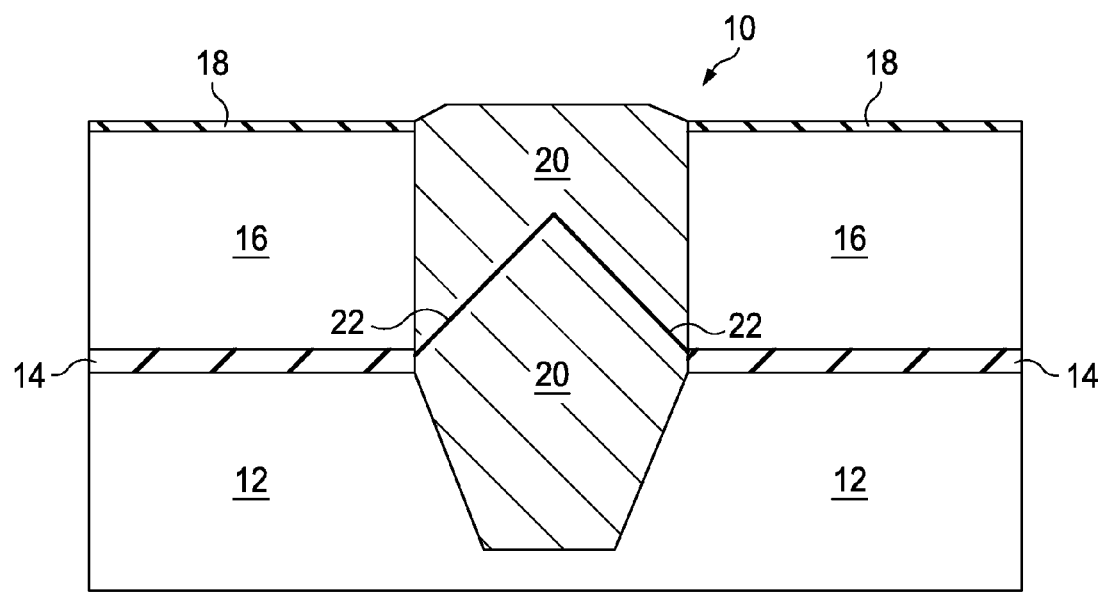
FIG. 1 shows a simplified cross-section through a semiconductor-on-insulator wafer including an electrical contact according to the inventive method.

FIG. 1 shows a cross-section through a semiconductor-on-insulator wafer 10 with a support wafer 12, a buried insulator layer 14 and a top silicon layer 16. An oxide layer 18 is formed on the surface of the top silicon layer 16. The oxide layer 18 may have a thickness of several hundreds of Å.

In an advantageous embodiment, the oxide layer has a thickness of about 10 Å to about 20 Å. The oxide layer 18 is covered by a photoresist layer which is not shown in FIG. 1. The photoresist is patterned to define those zones in which an electrical contact is to be formed. Then, a contact cavity 20 is etched into the top silicon layer 16, through the buried insulator layer 14 and into the support wafer 12. Of course, the etch also etches a hole into the oxide layer 18. The oxide mask thus formed defines those zones in which an electrical contact is to be formed.

After etching, the photoresist is removed and a selective epitaxial step is performed for depositing monocrystalline silicon in the freshly etched cavity 20 using the oxide mask formed out of the oxide layer 18. An added etch gas prevents growing of an epitaxial layer on the oxide mask. Thus, an epitaxial layer is selectively deposited only in cavity 20. As well known in the state of the art, the epitaxial layer will grow on all surfaces not protected by the oxide, i.e. on the bottom walls of the cavity 20 as well as on the side walls of cavity 20. Therefore, at the bottom part of the cavity, the crystalline structure will be another than in the top part of the cavity 20 as indicated by lines 22, which illustrate the limit, where the layers formed on the bottom walls meet the layers formed on the side walls of cavity 20.

Adjusting carefully the width of cavity 20, compared to the thickness of the top silicon layer 16 and adjusting the temperature and other parameters of the selective epitaxial step, the surface of the silicon filling the contact cavity 20 will be in the same crystal orientation as the surrounding surface of the top silicon layer. The selective epitaxial step is performed in such a way that the surface of the following epitaxial layer will be monocrystalline.

If the oxide layer has a thickness of more than 100 Å forming a conventional hard mask, it will then be removed by a wet etch as known in the state of the art.

In an advantageous embodiment, with an oxide mask of a thickness comprised between about 10 Å and about 20 Å, the oxide mask is removed by a hydrogen bake which will open the surface of the top silicon layer for the next epitaxial step, which may be for example a step of forming a silicon layer for a collector of a transistor. Usually, a hydrogen bake is performed at a temperature of about 1100° C. and may be performed in-situ in the epitaxial furnace.

Figure 2:
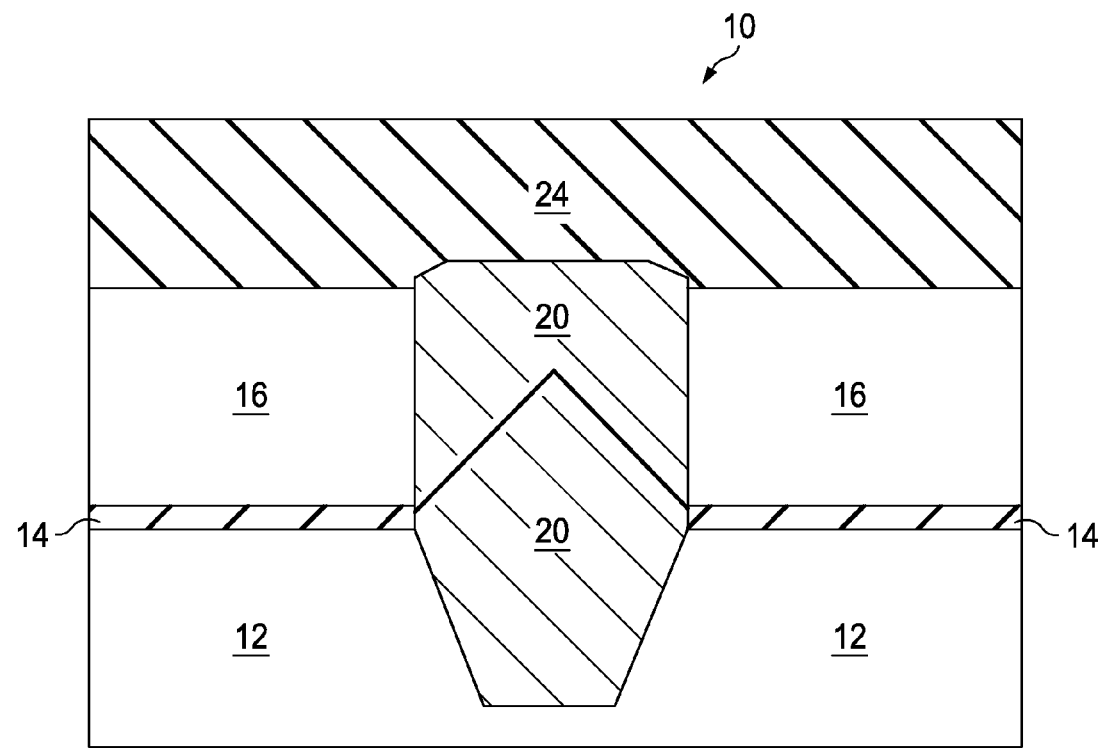
FIG. 2 shows the simplified cross-section of FIG. 1 comprising a further epitaxial layer.

FIG. 2 shows the SOI wafer 10 with the electrical contact formed in contact cavity 20 after an additional silicon layer, for example a collector epitaxial layer of silicon 24 has been grown on the top silicon layer 16. The surface of layer 24 is even and monocrystalline. The crystal structure is not disturbed. The electrical contact 20 allows using the support wafer as ground.

An electrical device comprising a contact 20 may be a circuit combining analog and digital functionality wherein the electrical contact provides an electrical contact to the support wafer which is used as ground.

Although the invention has been described hereinabove with reference to a specific embodiment, it is not limited to this embodiment and no doubt further alternatives will occur to the skilled person that lie within the scope of the invention as claimed.

The invention claim is:

1. Method of forming an electrical contact between a support wafer and a top silicon layer of a silicon-on-insulator wafer, the method comprising the following steps:
    etching a cavity through the top silicon layer and the insulator layer and into the support wafer;
    performing a selective epitaxial step for growing an epitaxial layer of silicon inside the cavity up to the surface of the top silicon layer including growing the epitaxial layer from a side surface of the top silicon layer and from a bottom surface of the cavity such that a top portion of the epitaxial layer has a first crystalline structure and a bottom portion of the epitaxial layer has a second crystalline structure different from the first crystalline structure, wherein the top portion of the epitaxial layer has the same crystalline orientation as the adjacent surface of the top silicon layer.

2. The method of claim 1, further comprising:
    forming an oxide layer on the surface of the top silicon layer and forming a patterned photoresist layer on the oxide layer prior to etching the cavity.

3. The method of claim 2, wherein
    the photoresist layer is removed after etching the cavity and the etched oxide layer forms an oxide mask for the selective epitaxial step.

4. The method of claim 3, wherein
    an etching gas is used during the selective epitaxial step to prevent growing of the epitaxial layer on the surface of the oxide mask.

5. The method of claim 2, wherein the oxide mask has a thickness comprised between about 10 Å and about 20 Å.

6. The method of claim 5, further comprising
    a baking step under hydrogen for removing the oxide mask after the cavity is filled up.

7. The method of claim 6, further comprising
    growing an epitaxial layer of silicon on the surface of the top silicon layer and a surface of the epitaxial layer of silicon formed inside the cavity in-situ after removing the oxide mask.

8. An electrical device comprising an electrical contact between a support wafer and a top silicon layer of a silicon-on-insulator wafer formed according to claim 1.

9. The method of claim 7, wherein the epitaxial layer of silicon on the surface has a surface that is even and monocrystalline.

10. Method of forming an electrical contact between a support wafer and a top silicon layer of a silicon-on-insulator wafer, the method comprising the following steps:
    forming an oxide layer over the top silicon layer;
    etching a cavity through the top silicon layer and the insulator layer and into the support wafer;
    performing a selective epitaxial step for growing a first epitaxial layer of silicon inside the cavity up to the surface of the top silicon layer including growing the first epitaxial layer from a side surface of the top silicon layer and from a bottom surface of the cavity such that a top portion of the epitaxial layer has the same crystalline orientation as the adjacent surface of the top silicon layer;
    removing the oxide layer; and
    epitaxially growing a second epitaxial layer of silicon on the top silicon layer and the first epitaxial layer, wherein the surface of the second epitaxial layer of silicon is even and monocrystalline as it extends from over the top silicon layer to over the first epitaxial layer and back to over the top silicon layer.

* * * * *